United States Patent
Hong et al.

(10) Patent No.: US 12,094,986 B1
(45) Date of Patent: Sep. 17, 2024

(54) QUANTUM-EFFICIENCY ENHANCED OPTICAL DETECTOR PIXEL HAVING ONE OR MORE OPTICAL SCATTERING STRUCTURES

(71) Applicant: Apple Inc., Cupertino, CA (US)

(72) Inventors: Sungkwon Hong, San Jose, CA (US); Erin F. Hanelt, Alameda, CA (US)

(73) Assignee: Apple Inc., Cupertino, CA (US)

( * ) Notice: Subject to any disclaimer, the term of this patent is extended or adjusted under 35 U.S.C. 154(b) by 389 days.

(21) Appl. No.: 17/412,097

(22) Filed: Aug. 25, 2021

(51) Int. Cl.
*H01L 31/02* (2006.01)
*H01L 31/0216* (2014.01)
*H01L 31/0232* (2014.01)
*H01L 27/146* (2006.01)

(52) U.S. Cl.
CPC .... *H01L 31/0232* (2013.01); *H01L 31/02164* (2013.01); *H01L 27/14603* (2013.01); *H01L 27/1462* (2013.01); *H01L 27/14627* (2013.01); *H01L 27/14643* (2013.01)

(58) Field of Classification Search
None
See application file for complete search history.

(56) References Cited

U.S. PATENT DOCUMENTS

| | | | |
|---|---|---|---|
| 4,042,821 A | 8/1977 | Mierzwinski |
| 5,479,032 A | 12/1995 | Forrest et al. |
| 7,135,698 B2 | 11/2006 | Mitra |
| 7,244,924 B2 | 7/2007 | Kiyomoto et al. |
| 8,816,415 B2 | 8/2014 | Liu et al. |
| 8,816,461 B2 | 8/2014 | Yuan et al. |
| 9,000,372 B2 | 4/2015 | Tsuchiya |
| 9,817,199 B2 | 11/2017 | Sherrer |
| 9,923,114 B2 | 3/2018 | de Lyon et al. |
| 10,344,328 B2 | 7/2019 | Barbee et al. |
| 10,374,072 B2 | 8/2019 | Nuzzo et al. |
| 10,375,282 B2 | 8/2019 | Ishida et al. |
| 10,462,402 B2 | 10/2019 | Fan |
| 10,644,187 B2 | 5/2020 | Chen et al. |
| 10,687,718 B2 | 6/2020 | Allec et al. |

(Continued)

FOREIGN PATENT DOCUMENTS

| | | |
|---|---|---|
| AU | 2018269000 | 1/2020 |
| JP | H09270527 | 10/1997 |

(Continued)

OTHER PUBLICATIONS

Sun et al., "Performance of dual-band short- or mid-wavelength infrared photodetectors based on InGaAsSb bulk materials and InAs/GaSb superlattices," Chin. Phys. B., vol. 26, No. 9, 2017, pp. 098506-1-098506-4.

(Continued)

*Primary Examiner* — Bilkis Jahan
(74) *Attorney, Agent, or Firm* — Brownstein Hyatt Farber & Schreck, LLP

(57) ABSTRACT

Various optical detector pixel embodiments are described. One optical detector pixel includes a photodiode having a first end opposite a second end, a set of lateral walls joining the first end and the second end, and a depth parallel to the set of lateral walls. A lens is positioned to direct light toward the first end of the photodiode. A set of one or more optical scattering structures laterally extends at least partially into an illumination area defined by the lens and has a set of sidewalls extending away from the first end. The set of sidewalls includes a pair of sidewalls forming an included angle. The included angle extends perpendicular to the depth of the photodiode. The pair of sidewalls abut a portion of the photodiode.

17 Claims, 12 Drawing Sheets

(56) References Cited

U.S. PATENT DOCUMENTS

| | | | |
|---|---|---|---|
| 10,808,150 | B2 | 10/2020 | Kato et al. |
| 11,158,757 | B2 | 10/2021 | Li et al. |
| 2015/0340391 | A1* | 11/2015 | Webster .............. H01L 27/1464 257/432 |
| 2016/0372507 | A1* | 12/2016 | Yang ...................... H04N 25/76 |
| 2019/0319055 | A1 | 10/2019 | Zaizen et al. |
| 2020/0219910 | A1* | 7/2020 | Shim ................. H01L 27/14689 |
| 2020/0310592 | A1* | 10/2020 | Bergström ............ G06F 3/0421 |
| 2020/0401270 | A1* | 12/2020 | Bergström ........... G02B 6/4206 |
| 2022/0037543 | A1 | 2/2022 | Arbore et al. |
| 2022/0397651 | A1* | 12/2022 | Murase ................. G01S 7/4816 |

FOREIGN PATENT DOCUMENTS

| | | |
|---|---|---|
| WO | WO 18/088083 | 5/2018 |
| WO | WO 18/187370 | 10/2018 |
| WO | WO 20/072458 | 4/2020 |

OTHER PUBLICATIONS

Jakšić et al., "Plasmonic Enhancement of Light Trapping in Photodetectors," *Facta Universitatis*, Series: Electronics and Energetics, vol. 27, No. 2, Jun. 2014, pp. 183-203.

Ma et al., Plasmonically Enhanced Graphene Photodetector Featuring 100 Dbit/s Data Reception, High Responsivity, and Compact Size, *ACS Photonics*, 2019, vol. 6, pp. 154-161.

Zhou et al., "Direct nearfield optical imaging of UV bowtie nanoantennas," *Optics Express*, vol. 17, Issue 22, 2009, pp. 20301-20306.

Piotrowski, "Recent progress in uncooled photodetection of the mid-infrared radiation," Communications and Photonics Conference (ACP), 2012, Asia, IEEE, Nov. 7, 2012, pp. 1-6.

* cited by examiner

QUANTUM-EFFICIENCY ENHANCED OPTICAL DETECTOR PIXEL HAVING ONE OR MORE OPTICAL SCATTERING STRUCTURES

FIELD

The described embodiments generally relate to optical detectors. More particularly, the described embodiments relate to optical detector pixels having one or more optical scattering structures that enhance their quantum efficiency (QE).

BACKGROUND

Sensors are included in many of today's electronic devices, including electronic devices such as smartphones, computers (e.g., tablet computers or laptop computers), wearable electronic devices (e.g., electronic watches, smart watches, or health monitors), game controllers, navigation systems (e.g., vehicle navigation systems or robot navigation systems), and so on. Sensors may variously sense the presence of objects, distances to objects, proximities of objects, movements of objects (e.g., whether objects are moving, or the speed, acceleration, or direction of movement of objects), compositions of objects, and so on. A sensor (e.g., an image sensor or a camera) may also or alternatively acquire an image of an object. One useful type of sensor is the optical detector.

SUMMARY

Embodiments of the systems, devices, methods, and apparatus described in the present disclosure pertain to optical detectors having one or more optical detector pixels ("detector pixels") and, more particularly, to optical detectors having optical scattering structures that help to scatter received light within a photodiode of an optical detector pixel, so that the light is more fully absorbed by the photodiode, thereby increasing the quantum efficiency (QE) of both the photodiode and the optical detector pixel. Embodiments of the systems, devices, methods, and apparatus described in the present disclosure also pertain to optical scattering structures that are constructed and positioned to scatter light away from one or more semiconductor structures (e.g., memory nodes) that might be adversely impacted by scattered light.

In a first aspect, a pixel of an optical detector is described. The pixel may include a photodiode having a first end opposite a second end, a set of lateral walls joining the first end and the second end, and a depth parallel to the set of lateral walls. A lens may be positioned to direct light toward the first end of the photodiode. A set of one or more optical scattering structures may laterally extend at least partially into an illumination area defined by the lens, and may have a set of sidewalls extending away from the first end. The set of sidewalls may include a pair of sidewalls forming an included angle. The included angle may abut a portion of the photodiode.

In a second aspect, another pixel of an optical detector is a described. The pixel may include a first region including a photodiode, a second region including a memory node, an oxide wall positioned at least partly between the first region and the second region, and a set of one or more optical scattering structures positioned at least partially within the photodiode and defining a set of edges. The set of edges may include one or more of a curved edge, or a first edge oriented at an oblique angle with respect to a second edge.

In a third aspect, another pixel of an optical detector is described. The pixel may include a photodiode and an optical scattering structure positioned on or in the photodiode. The optical scattering structure may have a set of sidewalls. The set of sidewalls may include a first sidewall and a second sidewall. The first sidewall and the second sidewall may be adjoining sidewalls, and the first sidewall and the second sidewall may be non-orthogonal and define an included angle. The first sidewall and the second sidewall may abut a portion of the photodiode.

In addition to the exemplary aspects and embodiments described above, further aspects and embodiments will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like structural elements, and in which.

Figure 1:
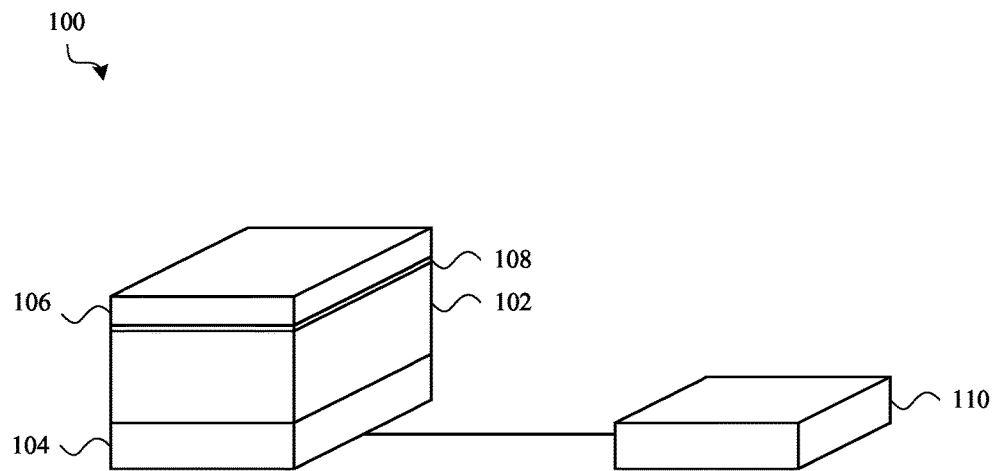
FIG. 1 shows an isometric view of an example single-pixel optical detector.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following description is not intended to limit the embodiments to one preferred embodiment. To the contrary, it is intended to cover alternatives, modifications, and equivalents as can be included within the spirit and scope of the described embodiments as defined by the appended claims.

The systems, devices, methods, and apparatus described in the present disclosure pertain to both single-pixel optical detectors, as might be used for ambient light sensing (ALS), wireless communication, proximity sensing, and so on, and multiple-pixel optical detectors, as might be used in a camera and/or image sensor (e.g., a complementary metal-oxide semiconductor (CMOS) image sensor), fingerprint sensor, depth sensor, and so on. To improve the QE of such an optical detector, an optical scattering structure may be disposed in a trench formed in a first end (e.g., in a light-receiving end) of a photodiode of the optical detector. Alternatively, the optical scattering structure may be embedded under a light-receiving surface of the first end of the photodiode. In some cases, more than one optical scattering structure may be provided, in different trenches in the light-receiving end of the photodiode and/or at the same or different depths under the light-receiving surface of the photodiode.

At times, an optical scattering structure can scatter light in undesirable directions, such as toward a memory node, transistor, or other structure of an optical detector pixel. This can result in increased optical crosstalk, increased parasitic light sensitivity (PLS), decreased modulation transfer function (MTF), and so on, and can in some cases degrade the performance (or even change the output) of an optical detector pixel. For example, undesirable scatter of light may result in a global shutter image sensor pixel (e.g., a pixel of a camera) or time-of-flight image sensor pixel producing an incorrect output. To reduce the scattering of light in undesirable directions, the optical detector pixels described herein include optical scattering structures having sidewalls, edges, and positions that can mitigate the scattering of light in undesirable directions and sometimes increase the scattering of light in desirable directions.

These and other aspects are described with reference to FIGS. 1-7B. However, those skilled in the art will readily appreciate that the detailed description given herein with respect to these figures is for explanatory purposes only and should not be construed as limiting.

Directional terminology, such as "top", "bottom", "upper", "lower", "front", "back", "over", "under", "above", "below", "left", "right", etc. is used with reference to the orientation of some of the components in some of the figures described below. Because components in various embodiments can be positioned in a number of different orientations, directional terminology is used for purposes of defining relative positions of various structures, and may not always define absolute positions. For example, a first structure described as being "above" a second structure and "below" a third structure is also "between" the second and third structures, and would be "above" the third structure and "below" the second structure if the stack of structures were to be flipped. Also, as used herein, the phrase "at least one of" preceding a series of items, with the term "and" or "or" to separate any of the items, modifies the list as a whole, rather than each member of the list. The phrase "at least one of" does not require selection of at least one of each item listed; rather, the phrase allows a meaning that includes one or more of any of the items, or one or more of any combination of the items, or one or more of each of the items. By way of example, the phrases "at least one of A, B, and C" or "at least one of A, B, or C" each refer to one or more of only A, only B, or only C; any combination of A, B, or C; and one or more of each of A, B, and C. Similarly, it may be appreciated that an order of elements presented for a conjunctive or disjunctive list provided herein should not be construed as limiting the disclosure to only that order provided.

As used herein, a "layer" refers to one or more materials that are typically, but not necessarily, parallel to the top surface and/or bottom surface of a substrate or another layer.

FIG. 1 shows an isometric view of an example single-pixel optical detector 100. By way of example, the optical detector 100 may be configured as an ALS, a wireless signal receiver, a proximity sensor, a display pixel health or calibration sensor, a reflected light sensor (e.g., a sensor that detects light emitted by a device and reflected off of one or more of a component of a device, a user of a device, or an object around which the device or a user of the device wants to navigate), and so on.

The optical detector 100 may include a photodiode 102. In some cases, the photodiode 102 may be formed on or in a substrate 104 (e.g., a semiconductor substrate, such as a silicon (Si) or gallium arsenide (GaAs) substrate). The photodiode 102 may be formed by means of epitaxial growth of one or more layers on the substrate 104, diffusion of ions into the substrate 104, implantation of ions into the substrate 104 (i.e., ion implantation), and so on. One or more other semiconductor structures (e.g., transistors, memory nodes, and so on) and/or layers of electrical interconnect (e.g., one or more patterned metal layers) may also be formed on or in the substrate 104. The other semiconductor structure(s) or layers of electrical interconnect may be used to bias the photodiode 102, clear (reset) a charge on the photodiode 102, read a charge from the photodiode 102, and so on.

A lens 106 may be positioned to direct light toward a first end (or light-receiving end, or light-receiving surface) of the photodiode 102. The light-receiving end of the photodiode 102 may have a light-receiving surface that is generally parallel to a top or bottom surface of the substrate 104. In some embodiments, and as shown, the lens 106 may be formed in a dielectric material and attached to the optical detector 100 (e.g., in a frontside illumination (FSI) configuration of the optical detector 100). In other embodiments, the lens 106 may be formed (e.g., etched) into the substrate 104 (e.g., in a backside illumination (BSI) configuration of the optical detector 100), and the photodiode 102 may receive light through the substrate 104.

Optionally, an anti-reflective material 108 may be deposited or grown on the light-receiving end of the photodiode 102, between the photodiode 102 and the lens 106.

A controller 110 may be directly or indirectly connected to the optical detector 100, and may provide signals (or instructions) for operating the optical detector 100. The signals (or instructions) may cause the optical detector 100 to be reset, enabled during a light integration period or light detection period, read, and so on.

Figure 2:
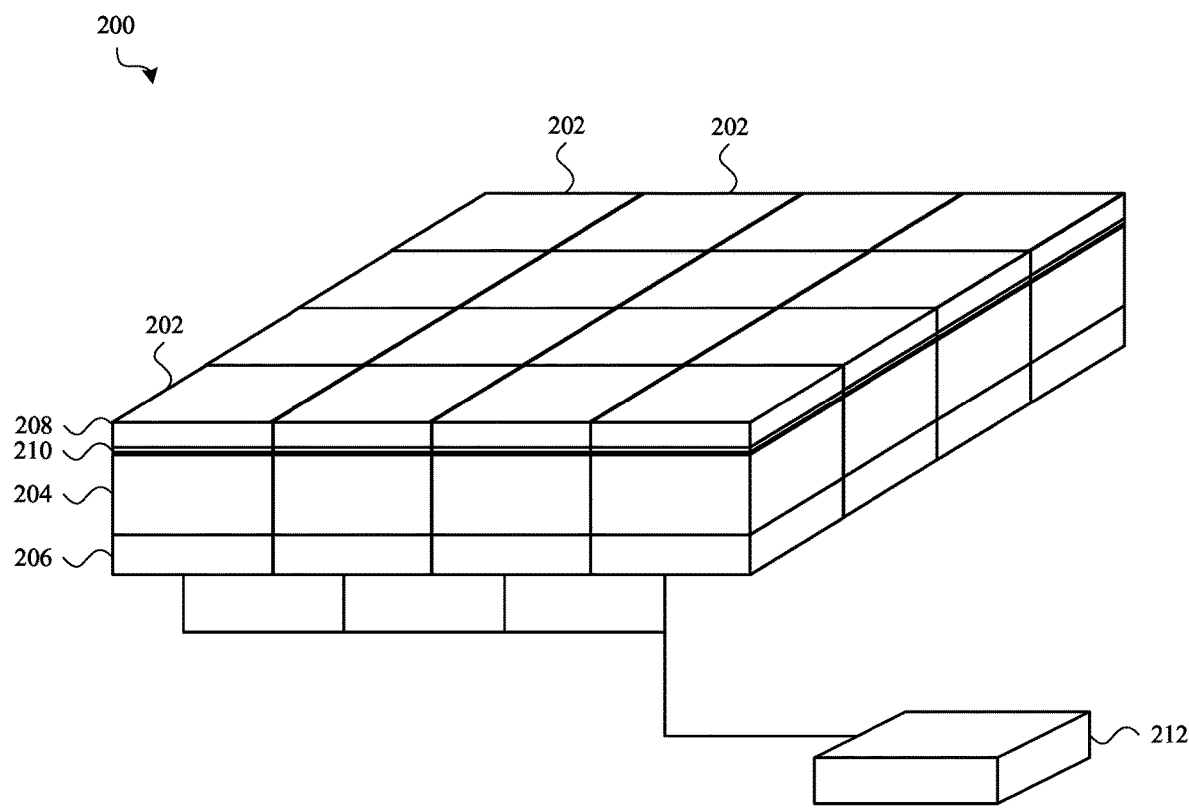
FIG. 2 shows an isometric view of an example multiple-pixel optical detector.

FIG. 2 shows an isometric view of an example multiple-pixel optical detector 200. The optical detector 200 may include a set or an array of pixels 202. By way of example, the array of pixels 202 are shown to be arranged in m columns and n rows (i.e., in an m×n array of pixels 202, where m and n are the same or different integers). However, the array of pixels 202 may alternatively be arranged in a single column or row, in concentric circles or other patterns, or in other ways.

Similarly to the optical detector described with reference to FIG. 1, the optical detector 200 may be configured as an ambient light sensor, a wireless signal receiver, a proximity sensor, a display pixel health or calibration sensor, a reflected light sensor (e.g., a sensor that detects light emitted by a device and reflected off of one or more of a component of a device, a user of a device, or an object around which the device or a user of the device wants to navigate), and so on. The optical detector 200 may also be used as a camera, image sensor, fingerprint sensor, depth sensor, and so on. Each pixel 202 of the optical detector 200 may be configured the same as, or similarly to, the single-pixel optical detector described with reference to FIG. 1, and may include a photodiode 204, a substrate 206, a lens 208, and/or an anti-reflective material 210.

A controller 212 may be directly or indirectly connected to the optical detector 200, and may provide signals (or instructions) for operating the optical detector 200. The signals (or instructions) may cause the array of pixels 202 of the optical detector 200 to be reset, enabled during a light integration period or light detection period, read, and so on. In some cases, the pixels 202 may be operated individually. In other cases, the pixels 202 may be operated collectively or in different subsets.

Figure 3A:
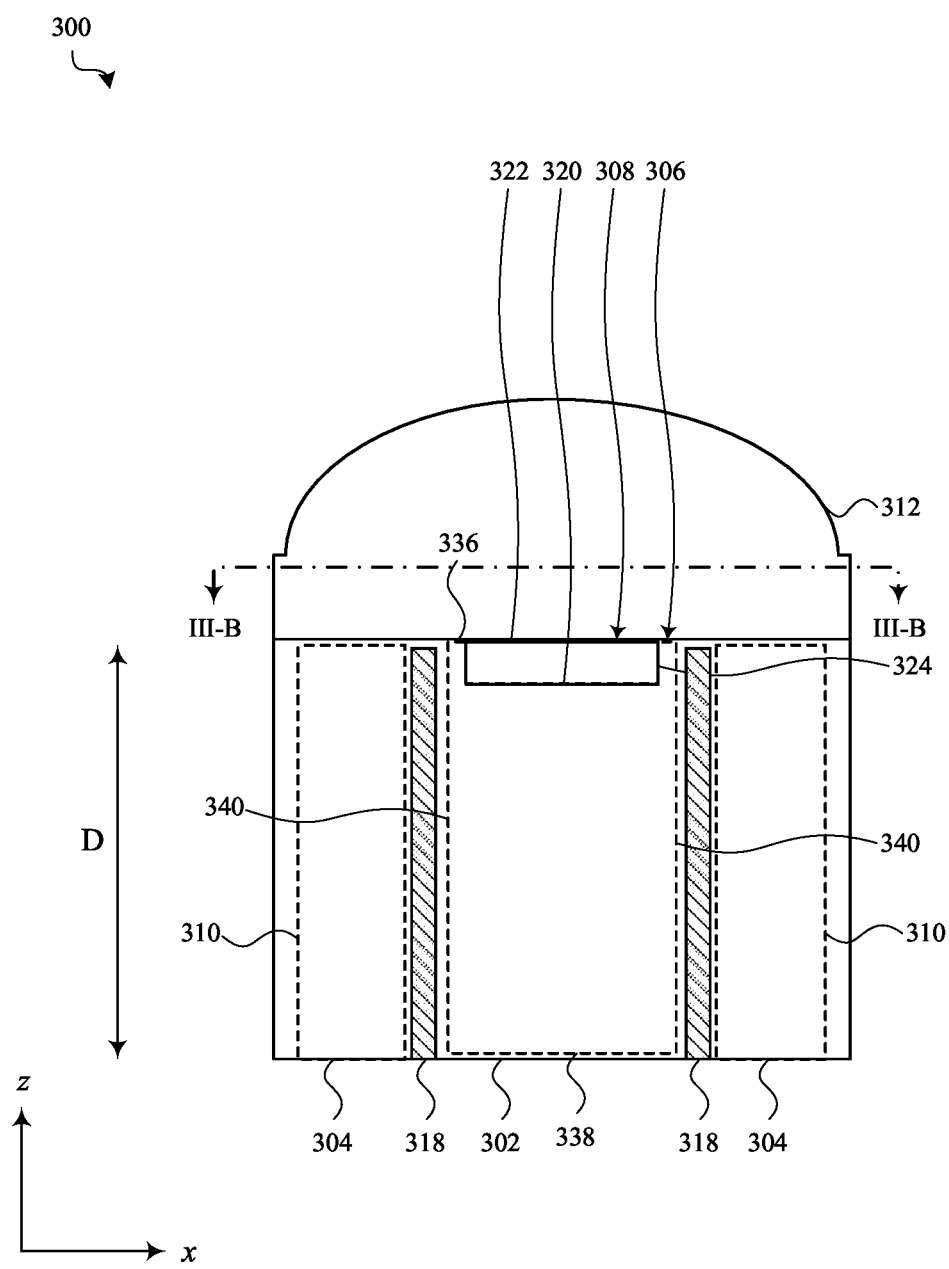
FIG. 3A shows an elevation of a first example pixel including a set of one or more optical scattering structures, which pixel may be used as, or in, an optical detector.
Figure 3B:
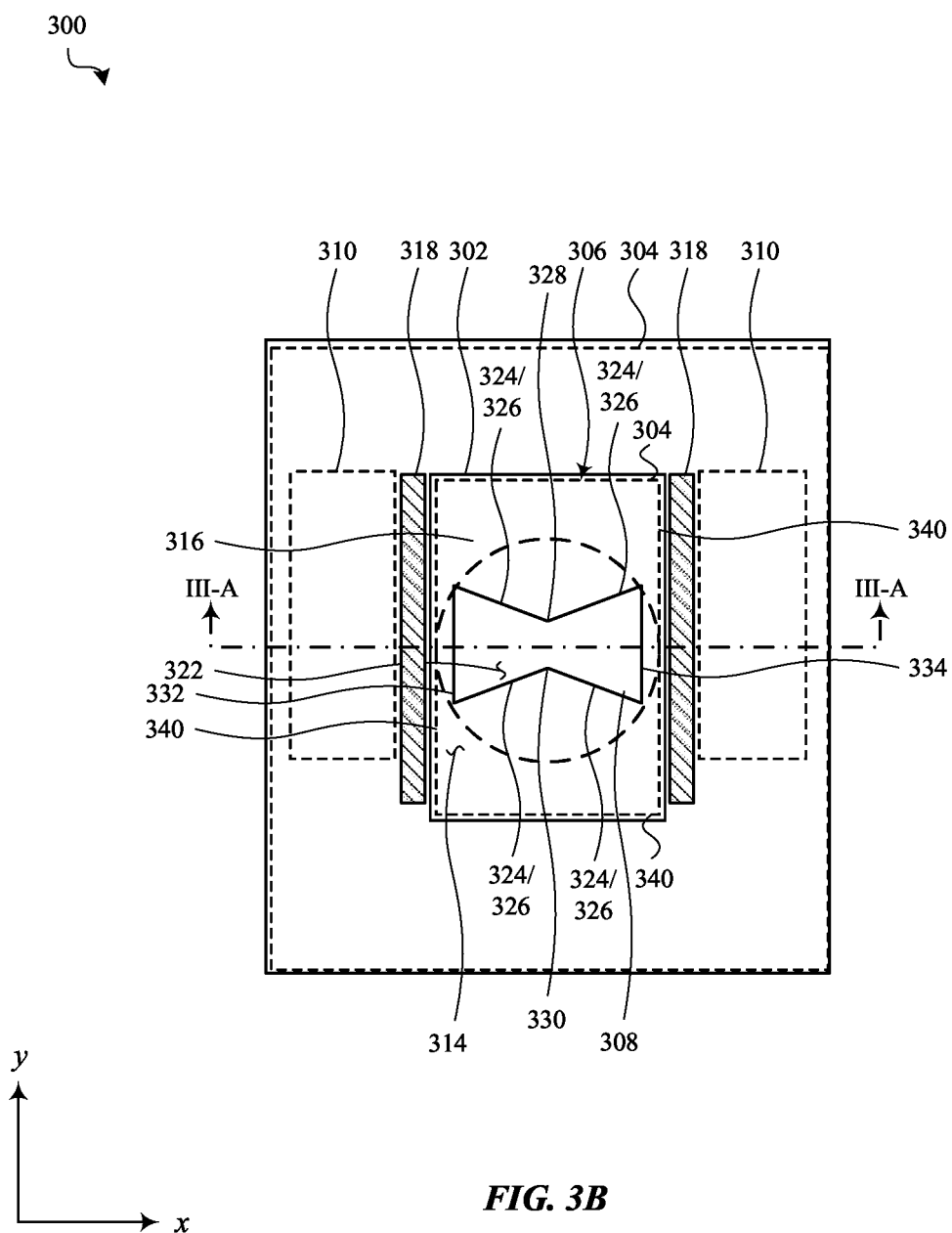
FIG. 3B shows a top down plan view of the example pixel shown in FIG. 3A.

FIGS. 3A and 3B show a first example pixel 300 including a set of one or more optical scattering structures 308. FIG. 3A shows an elevation of the pixel 300 (from view III-B—III-B in FIG. 3B), and FIG. 3B shows a top-down plan view of the pixel 300 (from view III-A-III-A in FIG. 3A). The pixel 300 may be used as, or in, an optical detector. In some embodiments, the pixel 300 may take the form of the single-pixel optical detector described with reference to FIG. 1, or one of the pixels in the multiple-pixel optical detector described with reference to FIG. 2.

The pixel 300 may include a first region 302 and a second region 304. By way of example, the second region 304 is shown to surround the first region 302. In alternative embodiments, the second region 304 may be adjacent the first region 302 (e.g., to the side, under, and/or over the first region 302).

The first region 302 may include a photodiode 306 and/or one or more other structures (e.g., one or more optical scattering structures 308, transistors, and so on). In some cases, the first region 302 may only include the photodiode 306 and one or more optical scattering structures 308. The second region 304 may include one or more semiconductor structures, such as one or more semiconductor structures 310, and/or one or more other structures. Each semiconductor structure 310 may be or include a memory node, a transistor, or another type of structure. In some embodiments, the second region 304 may include multiple (i.e., two or more) semiconductor structures 310.

The photodiode 306 may have a first end 336 opposite a second end 338. The first end 336 may include a light-receiving surface 314, or a surface on which at least some light initially impinges after passing through a lens 312. The first end 336 may also have one or more optical scattering structures 308 embedded therein or positioned thereon (or in some cases embedded close under the light-receiving surface 314). The photodiode 306 may also include a set of one or more lateral walls 340 that join the first end 336 and the second end 338. In some cases, the set of one or more lateral walls 340 may include a single wall having a circular lateral cross-section, or a square or rectangular lateral cross-section with arcuate turns at the corners of the square or rectangular lateral cross-section. In other cases, the set of one or more lateral walls 340 may include multiple walls that meet at ninety degree corners. The set of one or more lateral walls 340 may also take other forms. The photodiode 306 may have a depth, D, parallel to the set of lateral walls 340, and perpendicular to the lateral cross-section shown in FIG. 3B.

In some embodiments, a lens 312 (e.g., a microlens) may be positioned to direct light toward the first end 336 of the photodiode 338 (e.g., toward a light-receiving surface 314 of the photodiode 306) and/or one or more optical scattering structures 308 embedded in or under the first end 336 or light-receiving surface 314. In a BSI embodiment of the pixel 300, the lens 312 may be formed (e.g., etched) in the backside of a substrate on (or in) which the photodiode 306 is formed. In an FSI embodiment of the pixel 300, the lens 312 may be formed in a dielectric that is attached to the pixel 300. The lens 312 may in some cases focus (or direct) received light into an illumination area 316 (e.g., into a beam or spot of light) on the first end 336, or on the light-receiving surface 314 of the photodiode 306, and/or on surfaces or edges of the optical scattering structure(s) 308. Without the lens 312, light may still be received by the first end 336 or light-receiving surface 314 of the photodiode 306 and/or surfaces or edges of the optical scattering structure(s) 308, but without being directed into the illumination area 316 (e.g., without being focused into a beam or spot of light).

Optionally, an oxide wall or an oxide/metal wall 318, such as a deep trench isolation (DTI) wall or a shallow trench isolation (STI) wall, may be positioned at least partly between the first region 302 and the second region 304 (e.g., positioned around at least part of a lateral periphery of the photodiode 306 or first region 302, and/or extending at least partially around the set of lateral walls 340 of the photodiode 306). For purposes of this description, oxide/metal walls are walls that include both oxide and metal portions, such as oxide walls with embedded metal walls, metal conductors, or other metal structures. In some cases, the oxide (or oxide/metal) wall 318 may be positioned between the photodiode 306 and the semiconductor structure 310. In some cases, the oxide (or oxide/metal) wall 318 may extend partly and laterally around (e.g., 50%, 75%, or more of the way around) the first region 302 and/or the photodiode 306. In other cases, the oxide (or oxide/metal) wall 318 may laterally surround the first region 302 and/or the photodiode 306.

The set of one or more optical scattering structures 308 may be positioned at least partially within the photodiode 306 (e.g., the optical scattering structure(s) 308 may extend at least partially below a portion of the light-receiving surface 314 of the photodiode 306). The optical scattering structure(s) 308 may laterally extend at least partially into the illumination area 316 defined by the lens 312. By way of example, only one optical scattering structure 308 is shown. In alternative embodiments, there may be more than one optical scattering structure 308, positioned in the same or different planes (or between different starting and ending depths from the light-receiving surface 314 of the photodiode 306).

In some embodiments, a set of one or more trenches 320 may be formed in the light-receiving surface 314 of the photodiode 306, and may extend into the photodiode 306. The set of one or more optical scattering structures 308 may be disposed in the set of trenches 320. As shown, a light-receiving surface 322 of an optical scattering structure 308 may be flush with the light-receiving surface 314 of the photodiode 306. Alternatively, the optical scattering structure 308 may be fully embedded within the photodiode 306 (e.g., under the light-receiving surface 314 of the photodiode 306), or the optical scattering structure 308 may project above the light-receiving surface 314 of the photodiode 306.

Each optical scattering structure 308 may have a light-receiving surface 322, a set of sidewalls 324, and a set of edges 326. The sidewalls 324 may extend away from the light-receiving surface 322 of the optical scattering structure 308, and away from the first end 336 (or light-receiving surface 314) of the photodiode 306. For example, the sidewall(s) 324 of the optical scattering structure 308 may extend perpendicularly to the first end 336, the light-receiving surface 314, and the light-receiving surface 322. Each edge 326 may 1) define a transition between a surface (e.g., the surface 322) and a sidewall 324 of the optical scattering structure 308, or 2) define an inside or outside corner between two sidewalls 324 of the optical scattering structure 308. Light that impinges on the edges 326 or sidewalls 324 of an optical scattering structure 308 may be redirected (or scatter) within the photodiode 306 differently than light that impinges on the light-receiving surface 314 of the photodiode 306 (the latter of which may cause light to refract but not scatter). When the lens 312 is present, and in some cases, one or more optical scattering structures 308 may be positioned such that they laterally extend at least partially into the illumination area 316 defined by the lens 312.

The sidewalls 324 and edges 326 of the optical scattering structure(s) 308 may in some cases be positioned and/or oriented to direct (e.g., scatter) light in desired directions. For example, it may be desirable to direct light into the photodiode 306, to increase light absorption by the photodiode 306, but to direct light away from the semiconductor structure 310 and/or the second region 304, to prevent optical crosstalk and interference.

By way of example, and as shown, an optical scattering structure 308 may have a pair of sidewalls 324 (e.g., a pair of adjoining sidewalls 324) that form an included angle 328, with the included angle 328 extending perpendicular to the depth, D, of the photodiode 306, and with the pair of sidewalls 324 abutting a portion of the photodiode 306. For purposes of this description, an "included angle" is an angle formed between two structures (e.g., two surfaces, sidewalls, or edges) that intersect at an angle of one-hundred-eighty degrees (180°) or less. Although the included angle 328 is shown to be an obtuse angle formed by non-orthogonal sidewalls 324, the included angle 328 could alternatively be an acute angle or a right angle.

The optical scattering structure may also have a second pair of sidewalls 324 that form a second included angle 330. The included angle 330 may also extend perpendicular to the depth, D. of the photodiode 306, and may abut a different portion of the photodiode 306.

In the example shown, the optical scattering structure 308 has a lateral cross-section, parallel to the light-receiving surface 314 of the photodiode 306 and parallel to the light-receiving surface 322 of the optical scattering structure 308 (e.g., in a plane, or in all planes, that intersect the optical scattering structure 308 parallel to the light-receiving surface 322), defined by two intersecting triangles 332, 334.

In alternative embodiments of the pixel 300, the optical scattering structure 308 could take any of the forms described with reference to FIGS. 4A-5E, or the set of one or more optical scattering structures 308 could include multiple optical scattering structures, as described with reference to FIGS. 6A-7B.

Figure 4A:
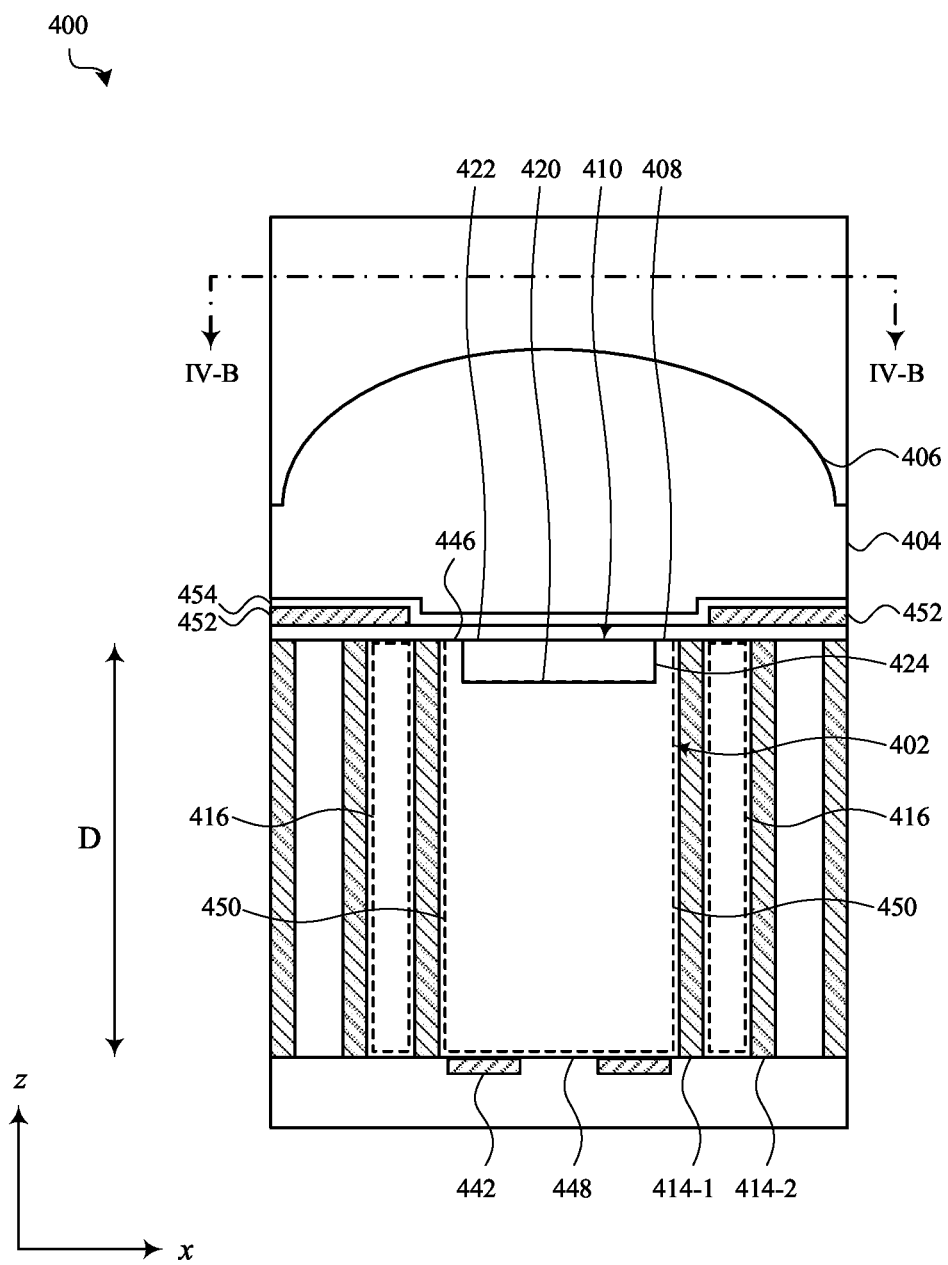
FIG. 4A shows an elevation of a second example pixel including a set of one or more optical scattering structures, which pixel may be used as, or in, an optical detector.
Figure 4B:
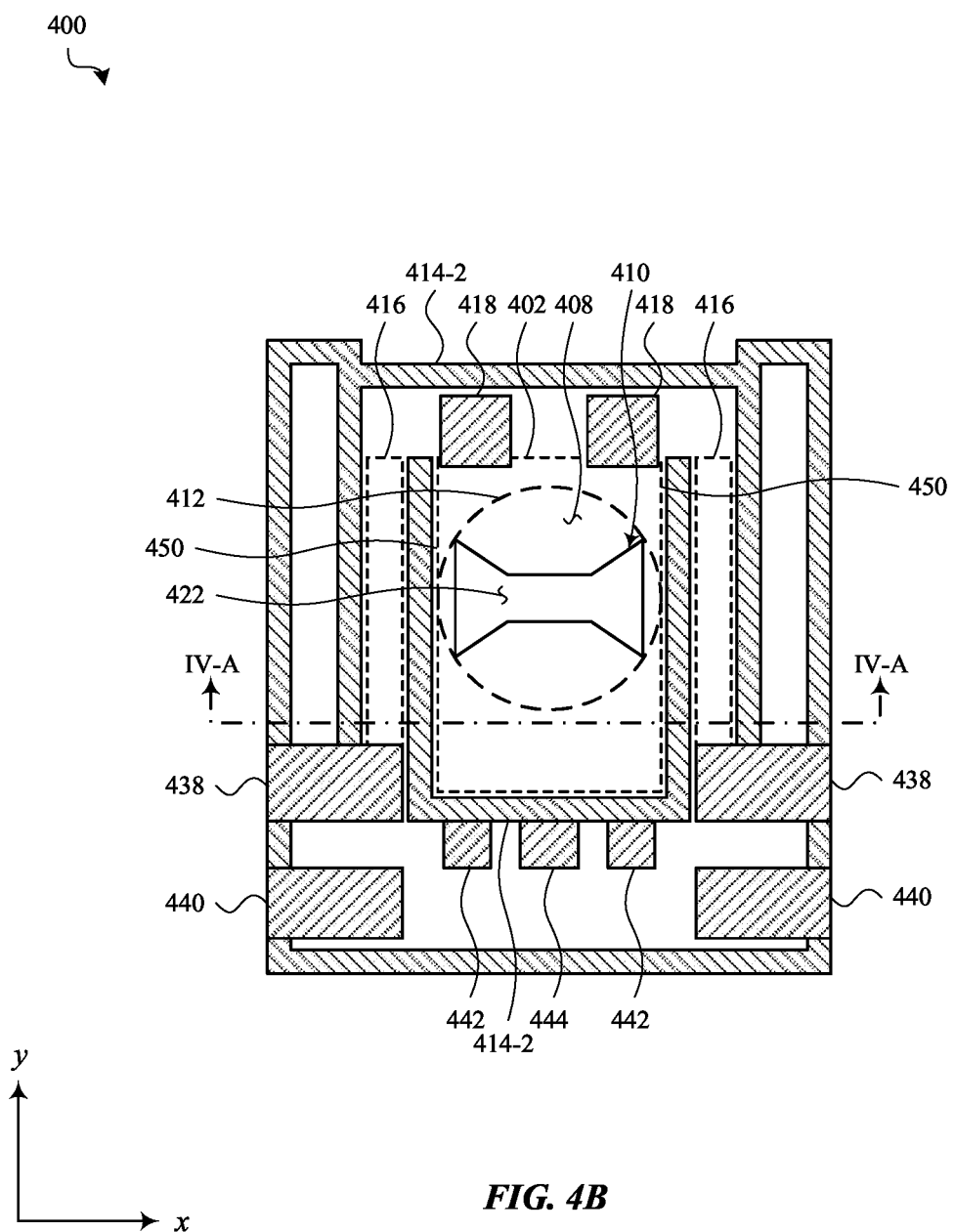
FIG. 4B shows a top down plan view of the example pixel shown in FIG. 4A.
Figure 4C:
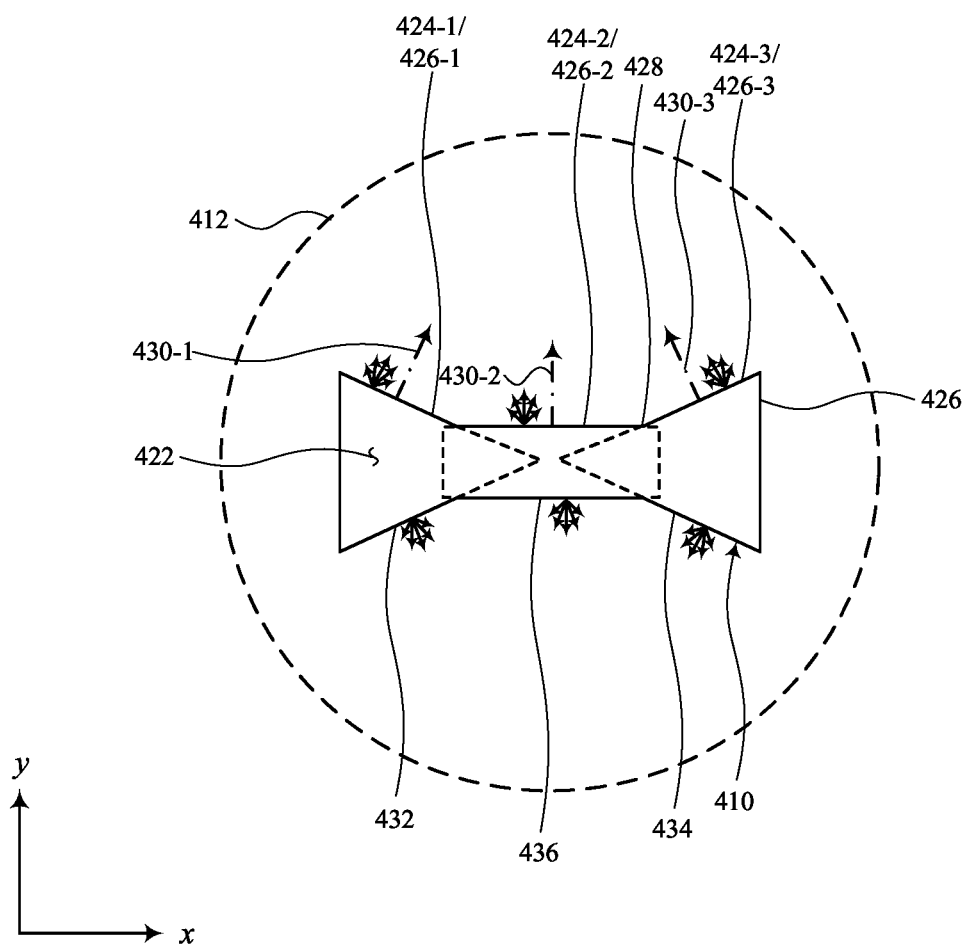
FIG. 4C shows an enlarged top down plan view of the optical scattering structure shown in FIGS. 4A and 4B.

FIGS. 4A-4C show a second example pixel 400 including a set of one or more optical scattering structures 410. FIG. 4A shows an elevation of the pixel 400 (from view IV-B-IV-B in FIG. 4B); FIG. 4B shows a top-down plan view of the pixel 400 (from view IV-A-IV-A in FIG. 4A); and FIG. 4C shows an enlarged top down plan view of the optical scattering structure 410. The pixel 400 may be used as, or in, an optical detector. In some embodiments, the pixel 400 may take the form of the single-pixel optical detector described with reference to FIG. 1, or one of the pixels in the multiple-pixel optical detector described with reference to FIG. 2.

The pixel 400 may include a photodiode 402 formed on a substrate 404. By way of example, the pixel 400 is configured as a BSI pixel, with the photodiode 402 receiving light through the substrate 404.

The photodiode 402 may have a first end 446 opposite a second end 448. The first end 446 may include a light-receiving surface 408, or a surface on which at least some light initially impinges after passing through the lens 406. The first end 446 may also have one or more optical scattering structures 410 embedded therein or positioned thereon (or in some cases embedded close under the light-receiving surface 408). The photodiode 402 may also include a set of one or more lateral walls 450 that join the first end 446 and the second end 448. In some cases, the set of one or more lateral walls 450 may include a single wall having a circular lateral cross-section, or a square or rectangular lateral cross-section with arcuate turns at the corners of the square or rectangular lateral cross-section. In other cases, the set of one or more lateral walls 450 may include multiple walls that meet at ninety degree corners. The set of one or more lateral walls 450 may also take other forms. The photodiode 402 may have a depth, D, parallel to the set of lateral walls 450.

The lens 406 (e.g., a microlens) may be positioned to direct light toward the first end 446 of the photodiode 402 (e.g., toward a light-receiving surface 408 of the photodiode 402) and/or one or more optical scattering structures 410 embedded in or under the first end 446 or light-receiving surface 408. The lens 406 may be formed (e.g., etched) in the backside of the substrate 404. The lens 406 may in some cases focus (or direct) received light into an illumination area 412 (e.g., into a beam or spot of light) on the first end 446, or on the light-receiving surface 408 of the photodiode 402, and/or on surfaces or edges of the optical scattering structure(s) 410. Without the lens 406, light may still be received by the first end 446 or light-receiving surface 408 of the photodiode 402 and/or surfaces or edges of the optical scattering structure(s) 410, but the light may not be directed into the illumination area 412 on the first end 446 or light-receiving surface 408.

One or more oxide (or oxide/metal) walls 414, such as one or more deep trench isolation (DTI) walls, may be positioned laterally around part of the photodiode 402. For example, a first oxide (or oxide/metal) wall 414-1 may form a first U-shaped wall (e.g., a squared-off U-shaped wall) around the photodiode 402, and a second oxide (or oxide/metal) wall 414-2 may form a second and larger U-shaped wall (e.g., a squared-off U-shaped wall) around part of the photodiode 402, with the bottom portions of the first and second U-shaped oxide (or oxide/metal) walls 414-1, 414-2 disposed on opposite lateral sides of the photodiode 402, and with the uprights of the U-shaped oxide (or oxide/metal) walls 414-1, 414-2 overlapping on opposite lateral sides of the photodiode 402. In some embodiments, the pixel 400 may include additional oxide (or oxide/metal) walls 414. Each of the oxide (or oxide/metal) walls 414, 414-1, 414-2 may be continuous or discontinuous. A discontinuous oxide (or oxide/metal) wall may include gaps through which conductive traces are routed. Each of the oxide (or oxide/metal) walls 414, 414-1, 414-2 may also extend from the front to the back of the pixel 400, or may have a depth that is shallower than the full depth of the pixel 400. An oxide (or oxide/metal) wall 414 that is shallower than the full depth of the pixel 400 may provide areas through which conductive traces may be routed, areas in which transistors 418, 438, 440, 442, 444 or other semiconductor structures may be formed, and so on.

By way of example, a memory node 416 may be disposed between each pair of overlapping uprights of the first and second U-shaped oxide (or oxide/metal) walls 414-1, 414-2. That is, different memory nodes 416 may be positioned to the left and to the right of the photodiode 402 shown in FIGS. 4A and 4B. A pair of transistors 418 may be simultaneously or sequentially pulsed to transfer all or a portion of a charge integrated by the photodiode 402 to one or both of the memory nodes 416. In some cases, a memory node 416 may be blocked from receiving light by a shield 452 placed between the lens 406 and the memory node 416. Additionally or alternatively, the lens 406 may direct received light away from the memory node(s) 416. In some cases, an anti-reflective (AR) coating 454 may be disposed between the lens/substrate 406/404 and photodiode/shields 402/452.

A set of one or more optical scattering structures 410 may be positioned at least partially within the photodiode 402 (e.g., the optical scattering structure(s) 410 may extend at least partially below a portion of the light-receiving surface 408 of the photodiode 402). The optical scattering structure(s) 410 may laterally extend at least partially into the illumination area 412 defined by the lens 406. By way of example, only one optical scattering structure 410 is shown. In alternative embodiments, there may be more than one optical scattering structure 410, positioned in the same or different planes (or between different starting and ending depths from the light-receiving surface 408 of the photodiode 402).

In some embodiments, a set of one or more trenches 420 may be formed in the light-receiving surface 408 of the photodiode 402, and may extend into the photodiode 402. The set of one or more optical scattering structures 410 may be disposed in the set of trenches 420. As shown, a light-receiving surface 422 of an optical scattering structure 410 may be flush with the light-receiving surface 408 of the photodiode 402. Alternatively, the optical scattering structure 410 may be fully embedded within the photodiode 402 (e.g., under the light-receiving surface 408 of the photodiode 402), or the optical scattering structure 410 may project above the light-receiving surface 408 of the photodiode 402.

Each optical scattering structure 410 may have a light-receiving surface 422, a set of sidewalls 424, and a set of edges 426. The sidewalls 424 may extend away from the light-receiving surface 422 of the optical scattering structure 410, and away from the first end 446 (or light-receiving surface 408) of the photodiode 402. For example, the sidewall(s) 424 of the optical scattering structure 410 may extend perpendicularly to the first end 446, the light-receiving surface 408, and the light-receiving surface 422. Each edge 426 may 1) define a transition between a surface (e.g., the light-receiving surface 422) and a sidewall 424 of the optical scattering structure 410, or 2) define an inside or outside corner between two sidewalls 424 of the optical scattering structure 410. Light that impinges on the edges 426 or sidewalls 424 of an optical scattering structure 410 may be redirected (or scatter) within the photodiode 402 differently than light that impinges on the light-receiving surface 408 of the photodiode 402 (the latter of which may cause light to refract but not scatter). When the lens 406 is present, and in some cases, one or more optical scattering structures 410 may be positioned such that they extend at least partially into the illumination area 412 defined by the lens 406.

The sidewalls 424 and edges 426 of the optical scattering structure(s) 410 may in some cases be positioned and/or oriented to direct (e.g., scatter) light in desired directions. For example, it may be desirable to direct light into the photodiode 402, to increase light absorption by the photodiode 402, but to direct light away from the memory nodes 416, to prevent optical crosstalk and interference between the integration of light by the photodiode 402 and the storage of charge by the memory nodes 416.

By way of example, and as shown, an optical scattering structure 410 may have one or more pairs of sidewalls 424 (e.g., pairs of adjoining sidewalls 424), with each pair of sidewalls 424 forming an included angle 428 extending perpendicular to the depth, D, of the photodiode 406, and with the pair of sidewalls 424 abutting a portion of the photodiode 402. Although the included angles 428 are shown to be obtuse angles formed by non-orthogonal pairs of sidewalls 424, the included angles 428 could alternatively be acute angles or right angles. A set of three sidewalls 424-1, 424-2, 424-3 may be arranged such that a first intersection between a first sidewall 424-1 and a second sidewall 424-2 defines a first obtuse angle, and such that a second intersection between a third sidewall 424-3 and the second sidewall 424-2 defines a second obtuse angle. Respective normals 430-1, 430-2, 430-3 to the first sidewall 424-1, the second sidewall 424-2, and the third sidewall 424-3 intersect. A second set of three sidewalls 424 may be disposed in a mirrored relationship with respect to the first set of three sidewalls 424-1, 424-2, 424-3.

In the example shown, the optical scattering structure 410 has a lateral cross-section, parallel to the light-receiving surface 408 of the photodiode 402 and parallel to the light-receiving surface 422 of the optical scattering structure 410 (e.g., in a plane, or in all planes, that intersect the optical scattering structure 410 parallel to the light-receiving surface 422), defined by two triangles 432, 434 joined by a bridge 436.

In alternative embodiments of the pixel 400, the optical scattering structure 410 could take any of the forms described with reference to FIGS. 4A-5E, or the set of one or more optical scattering structures 408 could include multiple optical scattering structures, as described with reference to FIGS. 6A-7B.

FIG. 4C shows how light incident on the edges 426 or sidewalls 424 of the optical scattering structure 410 may scatter. As shown, the light reflecting off of the edges 426-1 and 426-2 and sidewalls 424-1 and 424-3 may scatter primarily toward the interior of the photodiode 402, in directions that are less likely to result in light scattering between the first and second U-shaped oxide walls 414-1, 414-2 and changing the state of one or both of the memory nodes 416.

FIGS. 5A-5E show additional example optical scattering structures that may be used in one or more of the optical detector pixels described with reference to FIG. 1, 2, 3A-3B, or 4A-4C, or in other optical detector pixels.

Figure 5A:
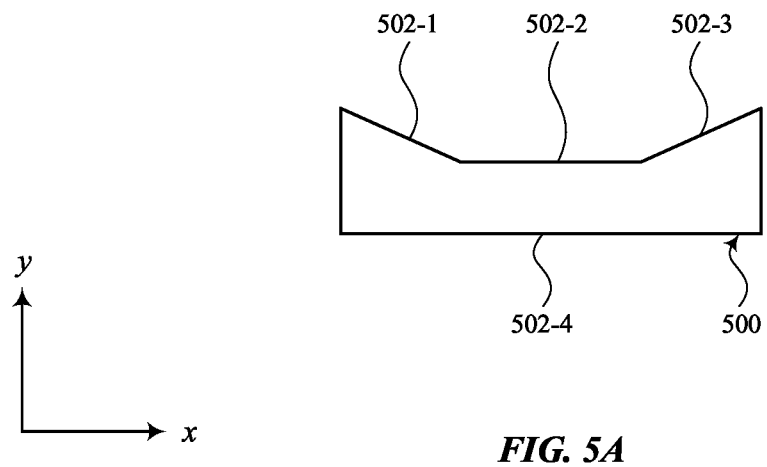
FIGS. 5A-5E show additional example optical scattering structures that may be used in one or more of the optical detector pixels described with reference to FIG. 1, 2, 3A-3B, or 4A-4C, or in other optical detector pixels.

The optical scattering structures shown in FIGS. 3A-3B and 4A-4C are symmetric about first, second, and third orthogonal axes (e.g., x and y axes parallel to the light-receiving surface of the photodiode, and a z axis perpendicular to the light-receiving surface of the photodiode). In contrast, FIG. 5A shows an optical scattering structure 500 that is symmetric about first and second orthogonal axes (x and z axes), and asymmetric about a third axis (y axis) orthogonal to each of the first and second orthogonal axes. The z axis may be the axis perpendicular a light-receiving surface of a photodiode.

By way of example, the optical scattering structure 500 has first, second, and third sidewalls 502-1, 502-2, 502-3 positioned similarly to the first set of three sidewalls described with reference to FIGS. 4A-4C, and a singular, flat sidewall 502-4 facing in a direction opposite the second sidewall 502-2.

Figure 5B:
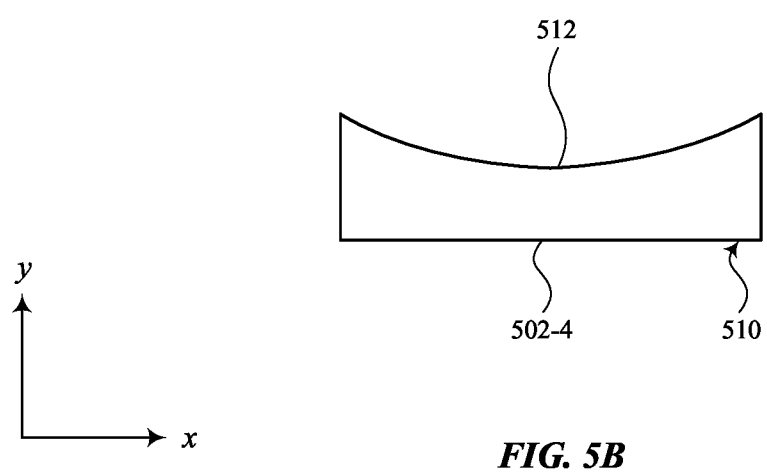

FIG. 5B shows an optical scattering structure 510 similar to the optical scattering structure described with reference to FIG. 5A, but with a singular curved sidewall 512 (bounded by curved edges) replacing the set of three sidewalls 502-1, 502-2, and 502-3. The curved sidewall 512 (and its upper and lower edges) are shown to have a concave shape, but could alternatively have a convex or other curved shape. An optical scattering structure may also have a sidewall having a different curved shape, more than one sidewall having a curved shape, or a perimeter having a continuously curved shape.

Figure 5C:
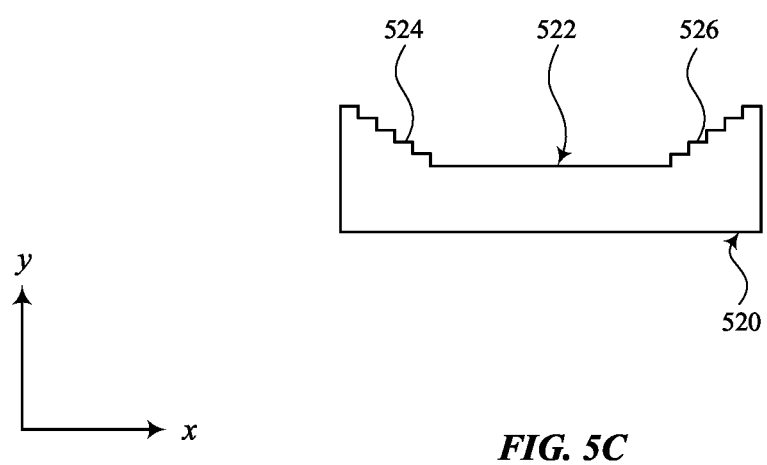

FIG. 5C shows an optical scattering structure 520 similar to the optical scattering structure described with reference to FIG. 5A, but with a multiple-step wall 522 replacing the first, second, and third sidewalls 502-1, 502-2, 502-3. By way of example, the multiple-step wall 522 includes multiple "inward steps" 524 extending toward a planar center of gravity of the optical scattering structure 520, and an equal number of "outward steps" 526 extending away from the planar center of gravity of the optical scattering structure 520. In alternative embodiments, the inward and outward steps 524, 526 may be of different size and different number, or the inward or outward steps 524, 526 may not have orthogonal sidewalls, or the optical scattering structure 520 may only have one set of steps (e.g., the inward or outward steps 524, 526 shown in FIG. 5C, but not both), or the optical scattering structure 520 may have steps formed on additional or different sidewalls, or the optical scattering structure 520 may have steps that give the optical scattering structure an overall different shape.

Figure 5D:
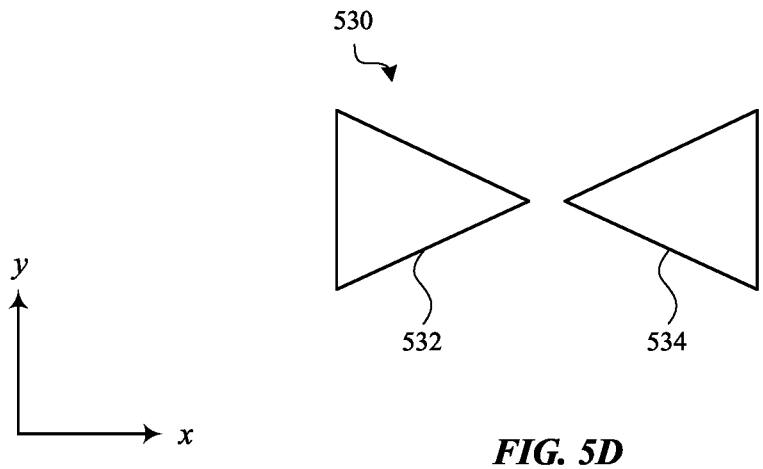

FIG. 5D shows a set of optical scattering structures 530 that is similar to the optical scattering structure described with reference to FIGS. 3A and 3B, but with the lateral cross-section of the optical scattering structure 530, parallel to a light-receiving surface of a photodiode, defined by two laterally spaced apart optical scattering structures 532, 534. By way of example, the two laterally spaced apart optical scattering structures 532, 534 are each shown to have a triangular lateral cross-section. In other embodiments, one or both of the optical scattering structures 532, 534 may have a differently shaped lateral cross-section, or the set of optical scattering structures 530 may include more than two optical scattering structures.

Figure 5E:
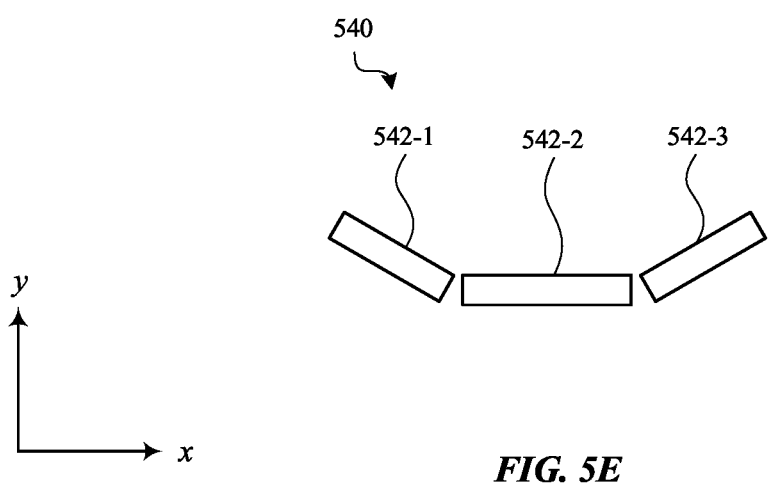

Each of FIGS. 3A-3B, 4A-4C, 5A, and 5D show a set of one or more optical scattering structures that defines a set of edges (and sidewalls), with each set of edges (and sidewalls) including at least a first edge (and associated first sidewall) that is oriented at an oblique angle with respect to a second edge (and associated second sidewall). Some of the sets of one or more optical scattering structures have two or more pairs of edges (and associated sidewalls) that are oriented at oblique angles with respect to each other. FIGS. 5D and 5E each show a set of optical scattering structures having two or more optical scattering structures, in which a first optical scattering structure includes a first edge; a second optical scattering structure, laterally spaced apart from the first optical scattering structure, includes a second edge; and the first edge of the first optical scattering structure is oriented at an oblique angle with respect to the second edge of the second optical scattering structure. In particular, FIG. 5E shows a set of optical scattering structures 540 including three laterally spaced apart optical scattering structures 542-1, 542-2, 542-3. By way of example, each of the optical scattering structures 542-1, 542-2, 542-3 is shown to have a rectangular cross-section parallel to a light-receiving surface of a photodiode. In alternative embodiments, one or more of the optical scattering structures may have a differently shaped cross-section and/or there may be more than three optical scattering structures.

As an example, the optical scattering structures 542-1, 542-2, 542-3 are laid out to mimic the set of three sidewalls described with reference to FIGS. 4A-4C and 5A, but the optical scattering structures 542-1, 542-2, 542-3 are laterally spaced apart such that portions of a photodiode may fill the spaces between them. In some cases, it may be easier to form three separate rectangular trenches to hold three separate optical scattering structures 542-1, 542-2, 542-3 than to form a single trench having non-orthogonal sidewalls.

Figure 6A:
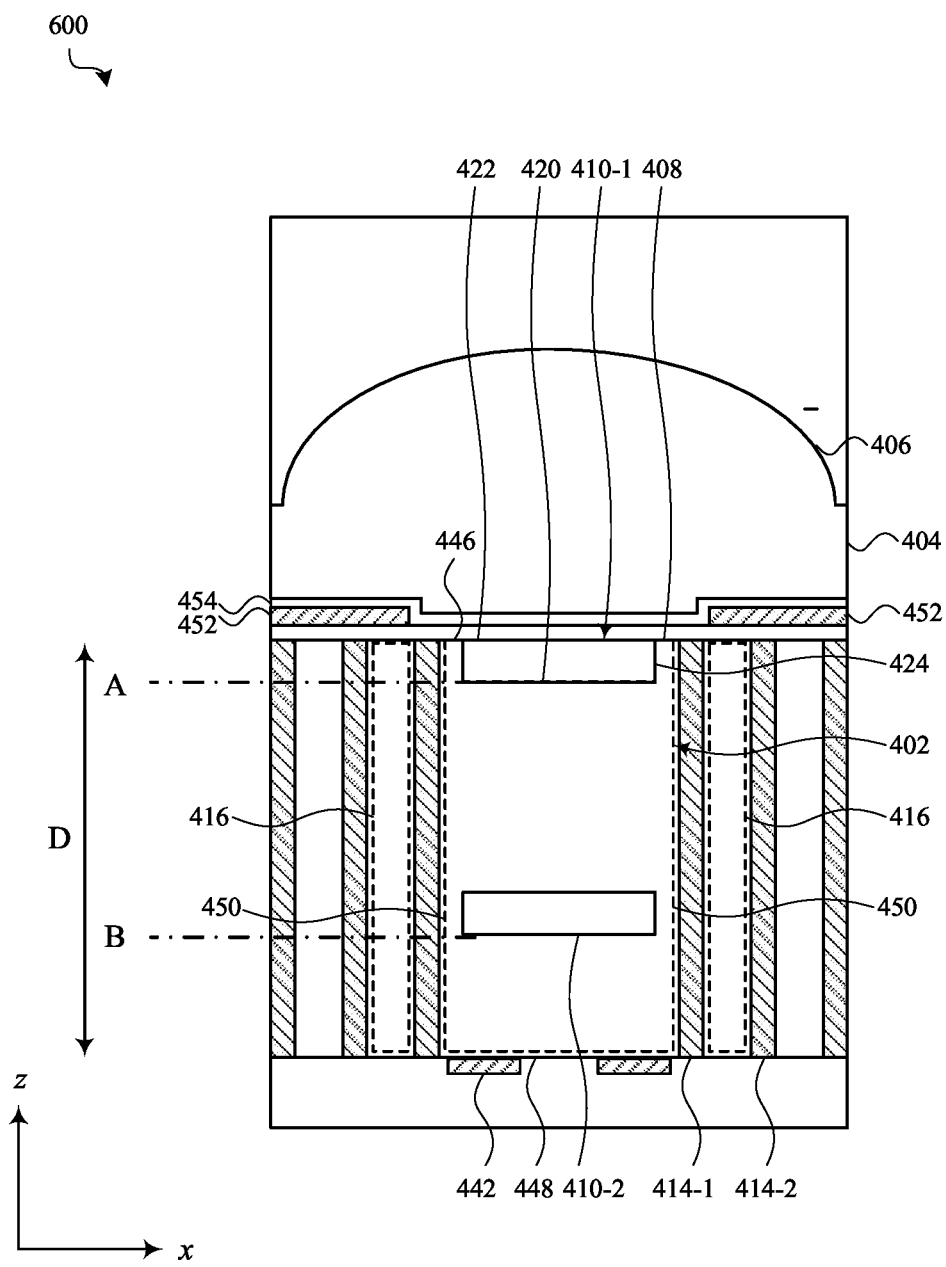
FIG. 6A shows an elevation of a third example pixel, which pixel includes optical scattering structures positioned at different depths within the pixel.
Figure 6B:
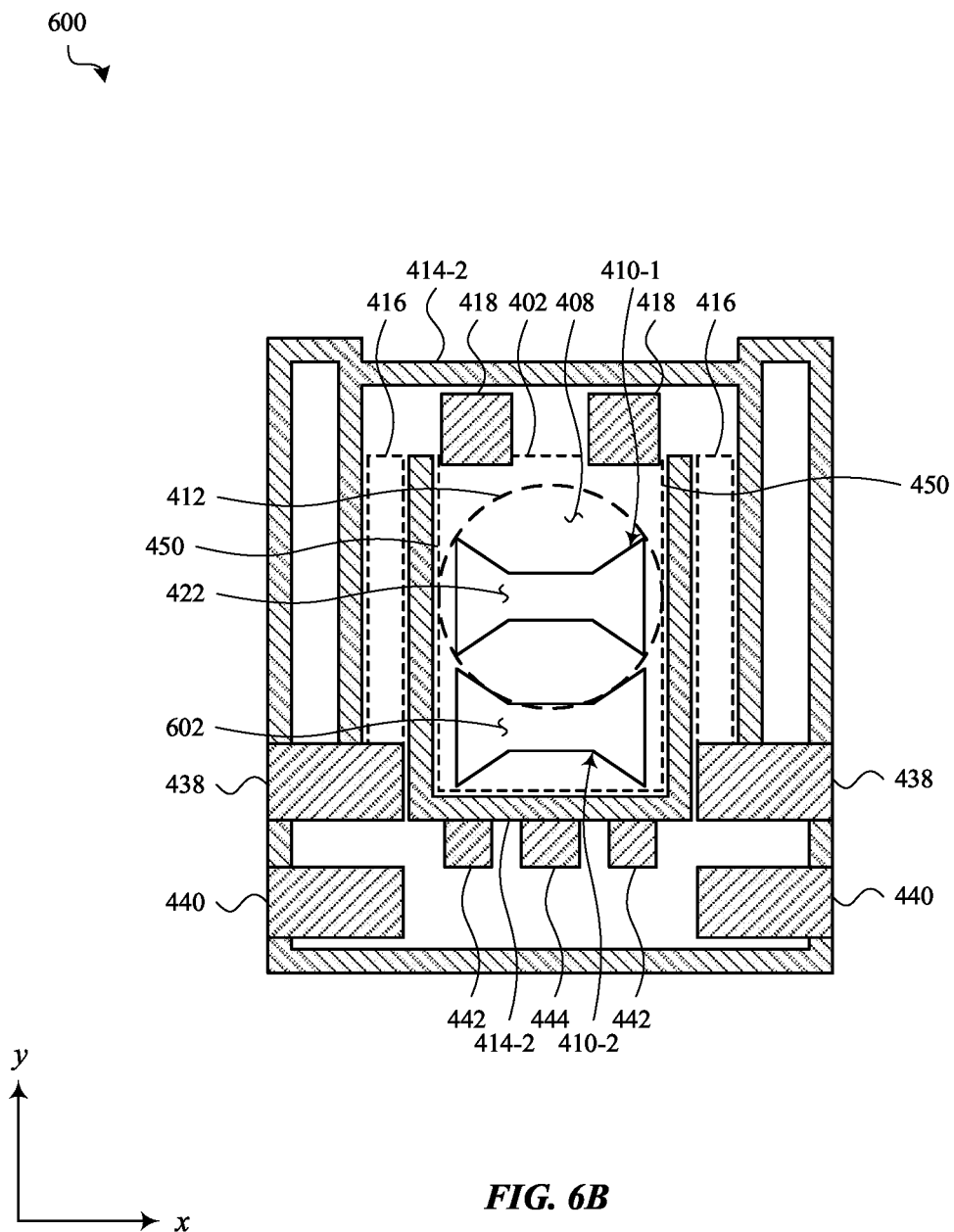
FIG. 6B shows a plan view of the example pixel shown in FIG. 6A.

FIGS. 6A and 6B show a third example pixel 600. The pixel 600 includes optical scattering structures 410-1, 410-2 positioned at different depths within the pixel 600. FIG. 6A shows an elevation of the pixel 600, and FIG. 6B shows a top-down plan view of the pixel 600. The pixel 600 may be used as, or in, an optical detector. In some embodiments, the pixel 600 may take the form of the single-pixel optical detector described with reference to FIG. 1, or one of the pixels in the multiple-pixel optical detector described with reference to FIG. 2. By way of example, the pixel 600 is shown and described as a variation of the pixel described with reference to FIGS. 4A-4C, and the same reference numerals are used below when appropriate. Like structures that are already shown in FIGS. 4A-4C may not be referenced or described further below.

The pixel 600 includes a first optical scattering structure 410-1 and a second optical scattering structure 410-2. The first optical scattering structure 410-1 may be the optical scattering structure described with reference to FIGS. 4A-4C, and may have a light-receiving surface 422 positioned flush with a light-receiving surface 408 of the photodiode 402. Alternatively, the first optical scattering structure 410-1 may be positioned entirely below the light-receiving surface 408 of the photodiode 402. The first optical scattering structure 410-1 may extend to a first depth (e.g., depth "A") within the photodiode 402.

By way of example, the second optical scattering structure 410-2 is shown to be shaped and constructed similarly to the first optical scattering structure 410-1. In alternative embodiments, the first and second optical scattering structures 410-1, 410-2 may have different shapes and/or constructions. The second optical scattering structure 410-2 may have a light-receiving surface 602 positioned below the light-receiving surface 408 of the photodiode 402. Alternatively, the light-receiving surface 602 of the second optical scattering structure 410-2 may be positioned flush with the light-receiving surface 408 of the photodiode 402. The second optical scattering structure 410-2 may extend to a second depth (e.g., depth "B") within the photodiode 402. The depth B may be farther away from the light-receiving surface 408 of the photodiode 402 than the depth A.

In some embodiments of the pixel 600, the second optical scattering structure 410-2 may be laterally offset from the first optical scattering structure 410-1 (sec, e.g., FIG. 6B). In alternative embodiments, the second optical scattering structure 410-2 may be vertically aligned with, or overlap a portion of, the first optical scattering structure 410-1.

Figure 7A:
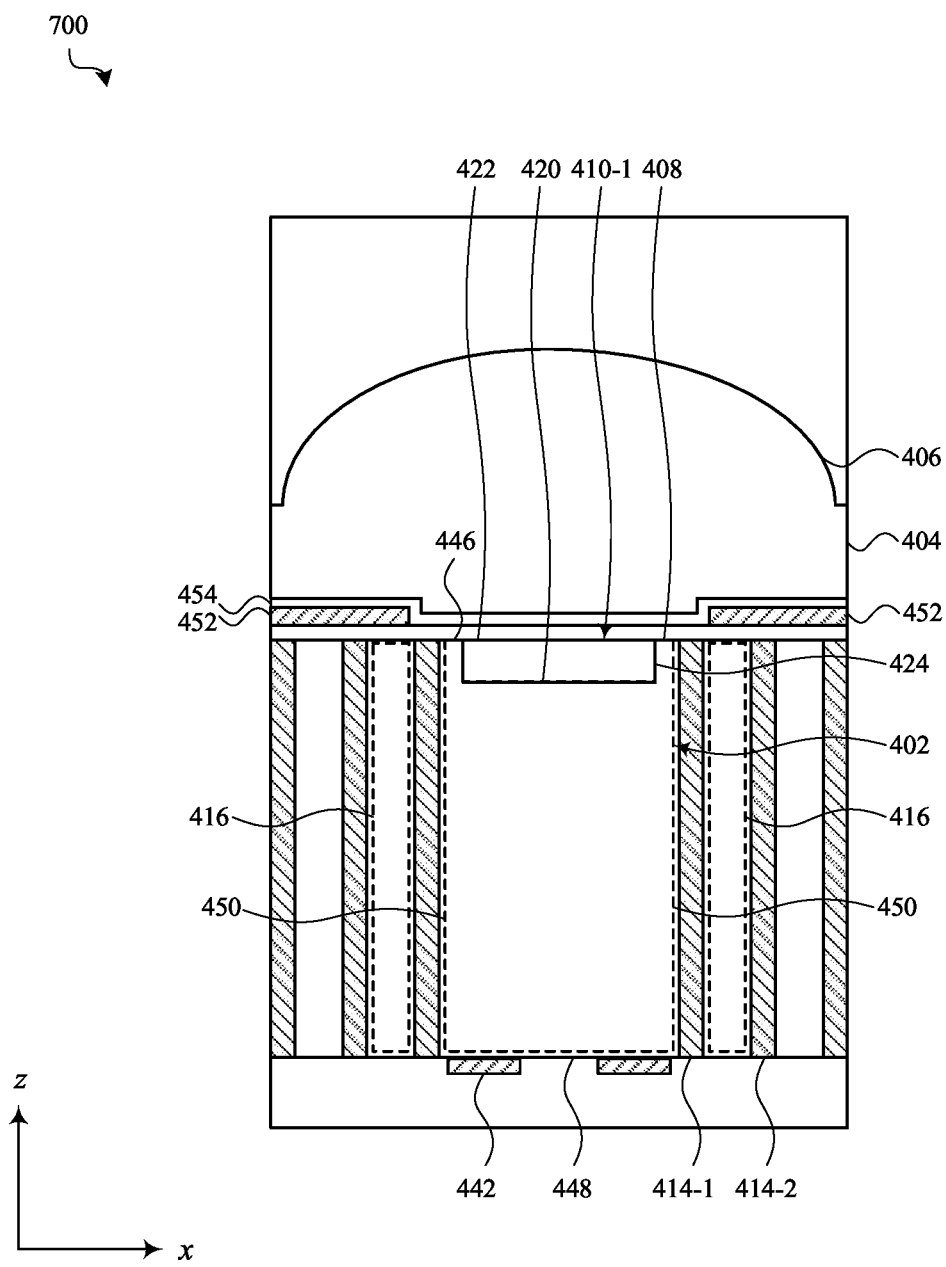
FIG. 7A shows an elevation of a fourth example pixel, which pixel includes optical scattering structures positioned at different depths within the pixel.
Figure 7B:
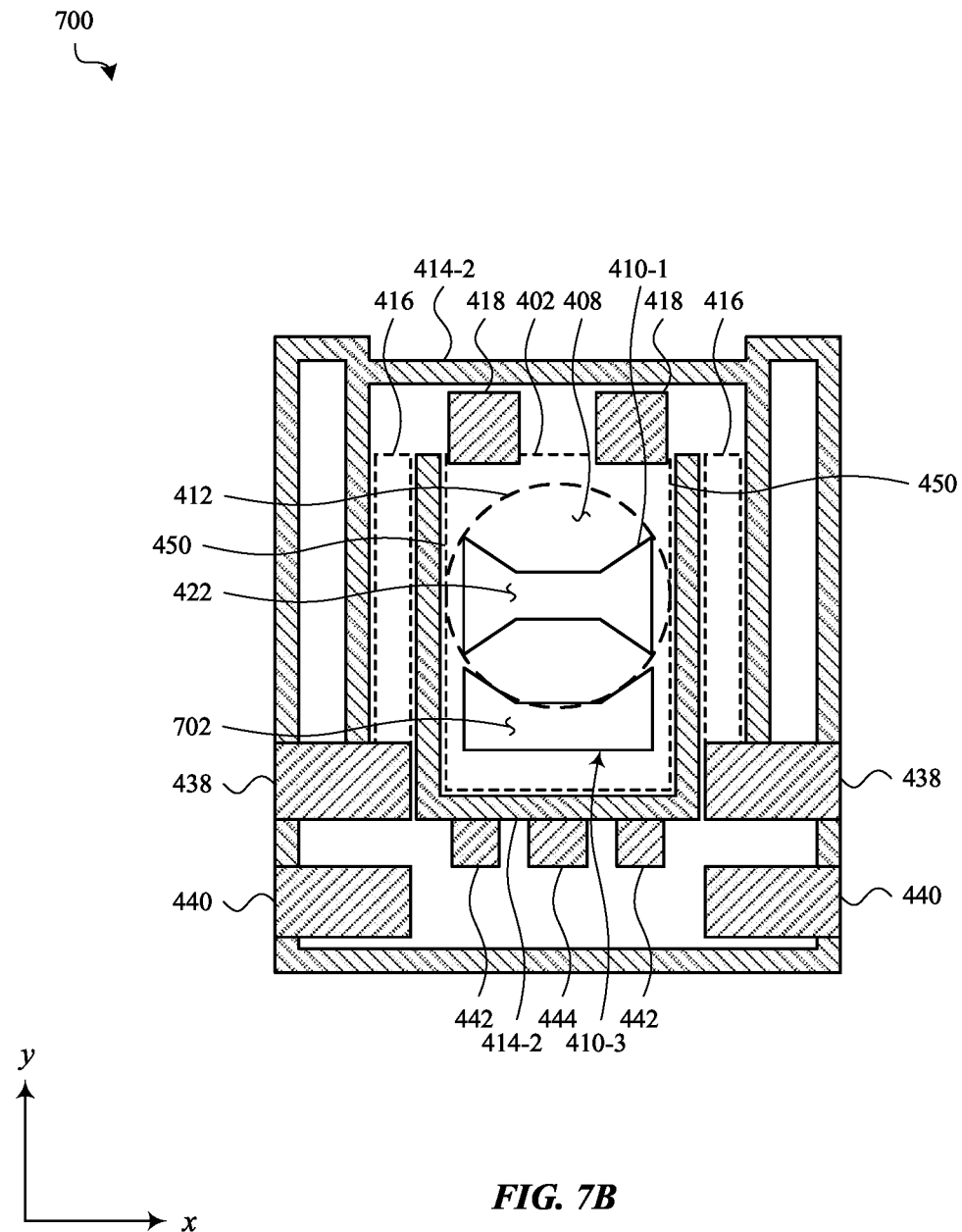
FIG. 7B shows a plan view of the example pixel shown in FIG. 7A.

FIGS. 7A and 7B show a fourth example pixel 700. The pixel 700 includes optical scattering structures 410-1, 410-3 positioned at different depths within the pixel 700. FIG. 7A shows an elevation of the pixel 700, and FIG. 7B shows a top-down plan view of the pixel 700. The pixel 700 may be used as, or in, an optical detector. In some embodiments, the pixel 700 may take the form of the single-pixel optical detector described with reference to FIG. 1, or one of the pixels in the multiple-pixel optical detector described with reference to FIG. 2. By way of example, the pixel 700 is shown and described as a variation of the pixel described with reference to FIGS. 4A-4C, and the same reference numerals are used below when appropriate. Like structures that are already shown in FIGS. 4A-4C may not be referenced or described further below.

The pixel 700 includes a first optical scattering structure 410-1 and a second optical scattering structure 410-3. The first optical scattering structure 410-1 may be the optical scattering structure described with reference to FIGS. 4A-4C, and may have a light-receiving surface 422 positioned flush with a light-receiving surface 408 of the photodiode 402. Alternatively, the first optical scattering structure 410-1 may be positioned entirely below the light-receiving surface 408 of the photodiode 402.

By way of example, the second optical scattering structure 410-3 is shown to be shaped differently from the first optical scattering structure 410-1. In alternative embodiments, the first and second optical scattering structures 410-1, 410-3 may have the same or different shapes and/or constructions. The second optical scattering structure 410-3 may have a light-receiving surface 702 positioned flush with the light-receiving surface 422 of the first optical scattering structure 410-1.

The first and second optical scattering structures 410-1, 410-3 may extend to the same depth within the photodiode 402. Because the light-receiving surfaces 422, 702 of the first and second optical scattering structures 410-1, 410-3 are flush, and because the light-receiving surfaces 422, 702 of the first and second optical scattering structures 410-1, 410-3 extend to the same depth, the first and second optical scattering structures 410-1, 410-3 may be referred to as co-planar.

In some alternative embodiments, the pixel described with reference to FIGS. 6A-6B or 7A-B may include additional optical scattering structures, which additional optical scattering structures are co-planar, non-co-planar, overlapping, or non-overlapping with other optical scattering structures.

The foregoing description, for purposes of explanation, uses specific nomenclature to provide a thorough understanding of the described embodiments. However, it will be apparent to one skilled in the art, after reading this description, that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art, after reading this description, that many modifications and variations are possible in view of the above teachings.

As described above, one aspect of the present technology may be the gathering and use of data, including optical data. The present disclosure contemplates that, in some instances, this gathered data may include personal information data (e.g., biological information) that uniquely identifies or can be used to identify, locate, contact, or diagnose a specific person. Such personal information data can include demographic data, location-based data, telephone numbers, email addresses, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to activate or deactivate various functions of the user's device, or gather performance metrics for the user's device or the user. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States (US), collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users may selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

What is claimed is:

1. A pixel of an optical detector, comprising:
   a photodiode having a first end opposite a second end, a set of one or more lateral walls joining the first end and the second end, a depth parallel to the set of one or more lateral walls, and a set of one or more trenches in the first end;
   a lens positioned to direct light toward the first end of the photodiode; and
   a set of one or more optical scattering structures disposed in the set of one or more trenches,
      laterally extending at least partially into an illumination area defined by the lens; and
      having a set of sidewalls extending away from the first end, the set of sidewalls including a pair of sidewalls forming an included angle in an exterior of an optical scattering structure of the set of one or more optical scattering structures, the included angle extending perpendicular to the depth of the photodiode, and the pair of sidewalls abutting a portion of the photodiode that extends into the included angle.

2. The pixel of claim 1, wherein the included angle is an acute angle.

3. The pixel of claim 1, wherein the included angle is an obtuse angle.

4. The pixel of claim 1, wherein the set of sidewalls defines a multiple-step wall including the pair of sidewalls.

5. The pixel of claim 1, wherein the set of one or more optical scattering structures has a lateral cross-section defined by two triangles joined by a bridge.

6. The pixel of claim 1, wherein the set of one or more optical scattering structures has a lateral cross-section defined by two intersecting triangles.

7. The pixel of claim 1, wherein the set of one or more optical scattering structures has a lateral cross-section defined by two or more laterally spaced apart optical scattering structures.

8. The pixel of claim 1, wherein:
   the pair of sidewalls includes a first sidewall and a second sidewall;
   the set of sidewalls includes a third sidewall;
   a first intersection between the first sidewall and the second sidewall defines a first obtuse angle;
   a second intersection between the third sidewall and the second sidewall defines a second obtuse angle; and
   respective normals to the first sidewall, the second sidewall, and the third sidewall intersect.

9. The pixel of claim 1, further comprising:
   a semiconductor structure; wherein,
   an edge of the pair of sidewalls is positioned to,
      receive a portion of the light directed toward the first end of the photodiode; and
      laterally scatter the received portion of the light away from the semiconductor structure.

10. The pixel of claim 9, wherein the semiconductor structure comprises a memory node.

11. The pixel of claim 9, further comprising an oxide wall or an oxide/metal wall extending at least partially around the set of one or more lateral walls of the photodiode.

12. A pixel of an optical detector, comprising:
   a first region including a photodiode;
   a second region including a memory node;
   an oxide wall or an oxide/metal wall positioned at least partly between the first region and the second region; and
   a set of one or more optical scattering structures positioned at least partially within the photodiode and defining a set of edges, the set of edges including at least one of,
      a curved edge; or
      a first edge oriented at an oblique angle with respect to a second edge.

13. The pixel of claim 12, wherein:
   the set of edges includes the curved edge; and
   the curved edge has a concave shape.

14. The pixel of claim 12, wherein:
   the set of edges includes the first edge and the second edge; and
   the set of one or more optical scattering structures includes,
      a first optical scattering structure including the first edge; and
      a second optical scattering structure, laterally spaced apart from the first optical scattering structure, including the second edge.

15. The pixel of claim 12, wherein:
   the set of one or more optical scattering structures includes, a first optical scattering structure extending to a first depth within the photodiode, the first depth perpendicular to a light receiving surface of the first optical scattering structure; and a second optical scattering structure extending to a second depth within the photodiode, different than the first depth, the second depth extending in a same direction as the first depth.

16. The pixel of claim 12, wherein the set of one or more optical scattering structures includes an optical scattering structure that is symmetric about first, second, and third orthogonal axes.

17. The pixel of claim 12, wherein the set of one or more optical scattering structures includes an optical scattering structure that is symmetric about first and second orthogonal axes, and asymmetric about a third axis orthogonal to each of the first and second orthogonal axes.

* * * * *